United States Patent
Pandey et al.

(10) Patent No.: US 9,177,623 B2
(45) Date of Patent: Nov. 3, 2015

(54) MEMORY INTERFACE OFFSET SIGNALING

(71) Applicant: QUALCOMM Incorporated, San Diego, CA (US)

(72) Inventors: Shree Krishna Pandey, San Diego, CA (US); Dexter T. Chun, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 282 days.

(21) Appl. No.: 13/842,515

(22) Filed: Mar. 15, 2013

(65) Prior Publication Data

US 2014/0281328 A1   Sep. 18, 2014

(51) Int. Cl.
| | | |
|---|---|---|
| *G06F 1/10* | (2006.01) | |
| *G11C 7/22* | (2006.01) | |
| *G06F 13/16* | (2006.01) | |
| *G06F 13/42* | (2006.01) | |

(52) U.S. Cl.
CPC *G11C 7/227* (2013.01); *G06F 1/10* (2013.01); *G06F 13/1689* (2013.01); *G06F 13/4243* (2013.01)

(58) Field of Classification Search
CPC ........... G06F 1/04; G06F 1/10; G06F 3/0619; G06F 13/1689; G06F 13/4243; G11C 7/18; G11C 7/22; G11C 7/222; G11C 7/227
See application file for complete search history.

(56) References Cited

U.S. PATENT DOCUMENTS

| | | | |
|---|---|---|---|
| 6,131,149 A | 10/2000 | Lu et al. | |
| 7,272,742 B2 | 9/2007 | Schoenfeld et al. | |
| 7,443,940 B2 | 10/2008 | Ferraiolo et al. | |
| 7,461,287 B2 | 12/2008 | Dreps et al. | |
| 7,661,084 B2 | 2/2010 | Hovis et al. | |
| 7,755,402 B1 | 7/2010 | Ku et al. | |
| 2003/0117301 A1 | 6/2003 | Savaria et al. | |
| 2003/0227296 A1 | 12/2003 | Lee | |
| 2006/0184817 A1* | 8/2006 | Dreps et al. | 713/503 |
| 2009/0077411 A1 | 3/2009 | Tokuhiro | |
| 2009/0113133 A1 | 4/2009 | Kim et al. | |
| 2009/0174455 A1* | 7/2009 | Dimitriu et al. | 327/295 |
| 2012/0044003 A1* | 2/2012 | Itou et al. | 327/160 |
| 2014/0347108 A1* | 11/2014 | Zerbe et al. | 327/158 |

OTHER PUBLICATIONS

International Search Report and Written Opinion—PCT/US2014/026146—ISA/EPO—Aug. 26, 2014.
Taiwan Search Report—TW103109478—TIPO—Jun. 2, 2015.

* cited by examiner

*Primary Examiner* — Dennis M Butler
(74) *Attorney, Agent, or Firm* — Seyfarth Shaw LLP

(57) ABSTRACT

A memory interface includes circuitry configured for applying a variable delay to a portion of a data signal and applying a variable delay to a data strobe. The delayed data strobe samples the delayed portion of the data signal. Delayed portions of the data signal are spaced away from non-delayed portions of the data signal by alternating the routing of delayed bits and non-delayed bits of the data signal. A training block determines and sets a value of the variable delay corresponding to a largest value of a number of recorded eye aperture widths.

17 Claims, 12 Drawing Sheets

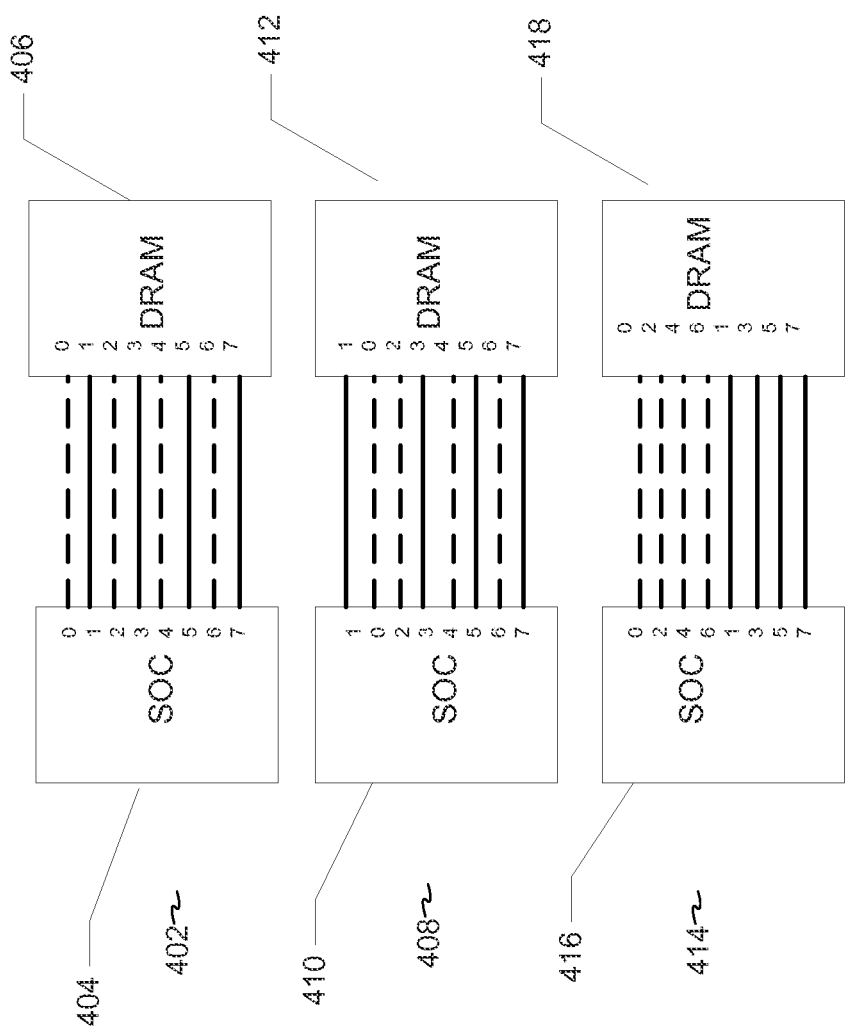

MEMORY INTERFACE OFFSET SIGNALING

TECHNICAL FIELD

The present disclosure relates generally to memory interface circuitry. More specifically, the present disclosure relates to reduction of crosstalk and noise in a memory interface.

BACKGROUND

In source synchronous memory interfaces, such as Low Power Double Data Rate (LPDDR) memories and Double Data Rate (DDR) memories, crosstalk and Power Distribution Network (PDN) noise are key performance bottlenecks. The performance of a memory interface may be observed using eye diagram analysis techniques in which dimensions of an eye diagram aperture are indicative of signal integrity across the interface. Crosstalk and PDN noise may limit the maximum achievable frequency (fmax) of a memory interface. This affect can be observed as a limitation on dimensions of an eye aperture on an eye diagram.

Reduction of crosstalk noise is currently achieved by increasing spacing between signal routes and by using termination at the ends of the routes. This technique increases the area used by a memory interface. Reduction of PDN noise is currently achieved by altering power routing, ground plane design, adding decoupling capacitors or by other techniques such as data bus inversion (DBI), for example. These techniques add complexity to a chip design and may also increase the area of the memory interface.

SUMMARY

A memory interface method according to an aspect of the present disclosure includes applying an operating delay to only a first set of bits of a data channel of a memory interface waveform and transmitting the delayed first set of bits across a memory interface. According to this aspect of the disclosure, the method also includes transmitting a second set of bits of the data channel across the memory interface. The first set of bits is interwoven with the second set of bits on the data channel.

A memory interface according to another aspect of the present disclosure includes means for applying an operating delay to only a first set of bits of a data channel of a memory interface waveform and means for transmitting the delayed first set of bits across the memory interface. According to this aspect, the memory interface also includes means for transmitting a second set of bits of the data channel across the memory interface. The first set of bits is interwoven with the second set of bits on the data channel.

A memory interface according to still another aspect of the present disclosure includes a first data path coupled to a first set of bits of a data signal, a first variable delay circuit coupled between the first data path and a first latch, and a second data path coupled between a second set of bits of the data signal a second latch. According to this aspect, the memory interface also includes a first strobe path coupled to a first strobe signal, a second variable delay circuit coupled between the first strobe path and the first latch and a second strobe path coupled between the first strobe signal and the second latch.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

The features, nature, and advantages of the present disclosure will become more apparent from the detailed description set forth below when taken in conjunction with the drawings in which like reference characters identify correspondingly throughout.

FIG. 4 is a block diagram conceptually illustrating interweaving of phase delayed signals with non-phase delayed signals in a memory interface according to aspects of the present disclosure.

DETAILED DESCRIPTION

Figure 1A:
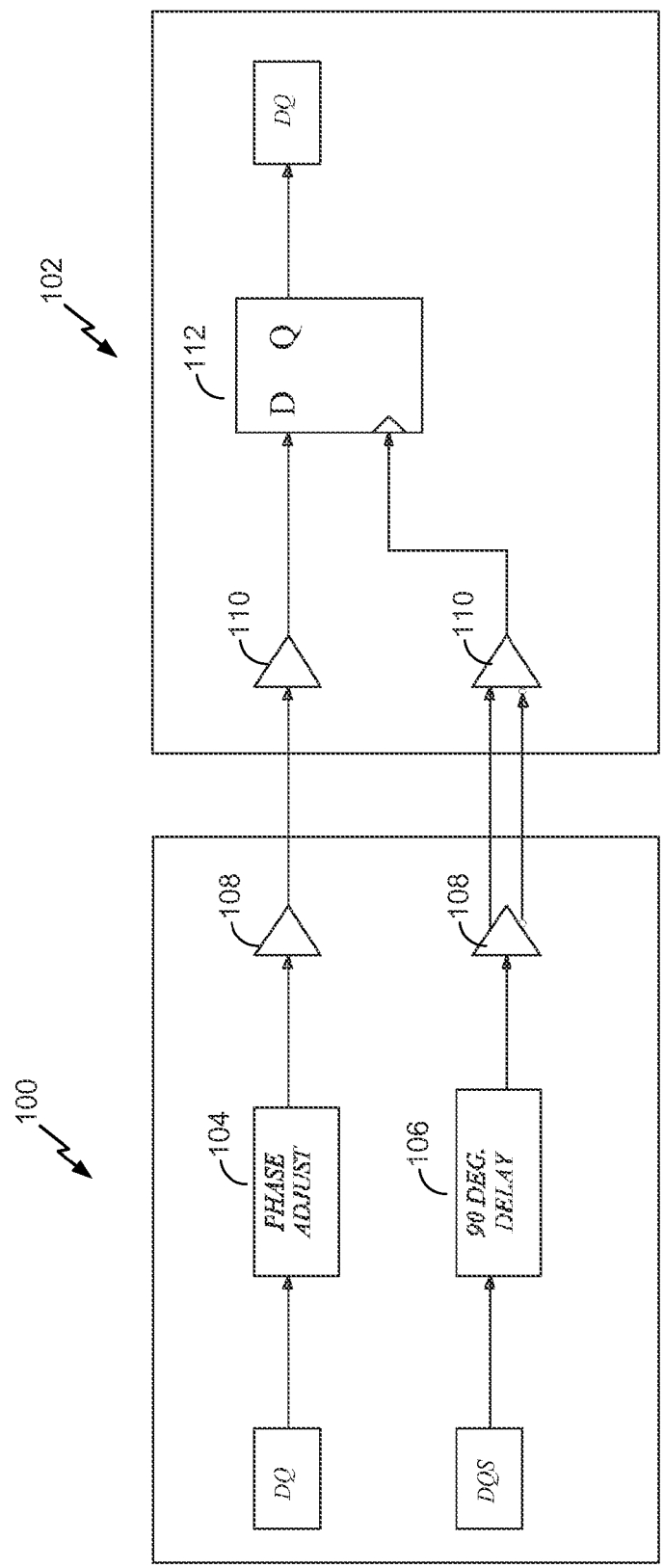
FIG. 1A is a schematic diagram illustrating an example of a memory interface in the write direction.
Figure 1B:
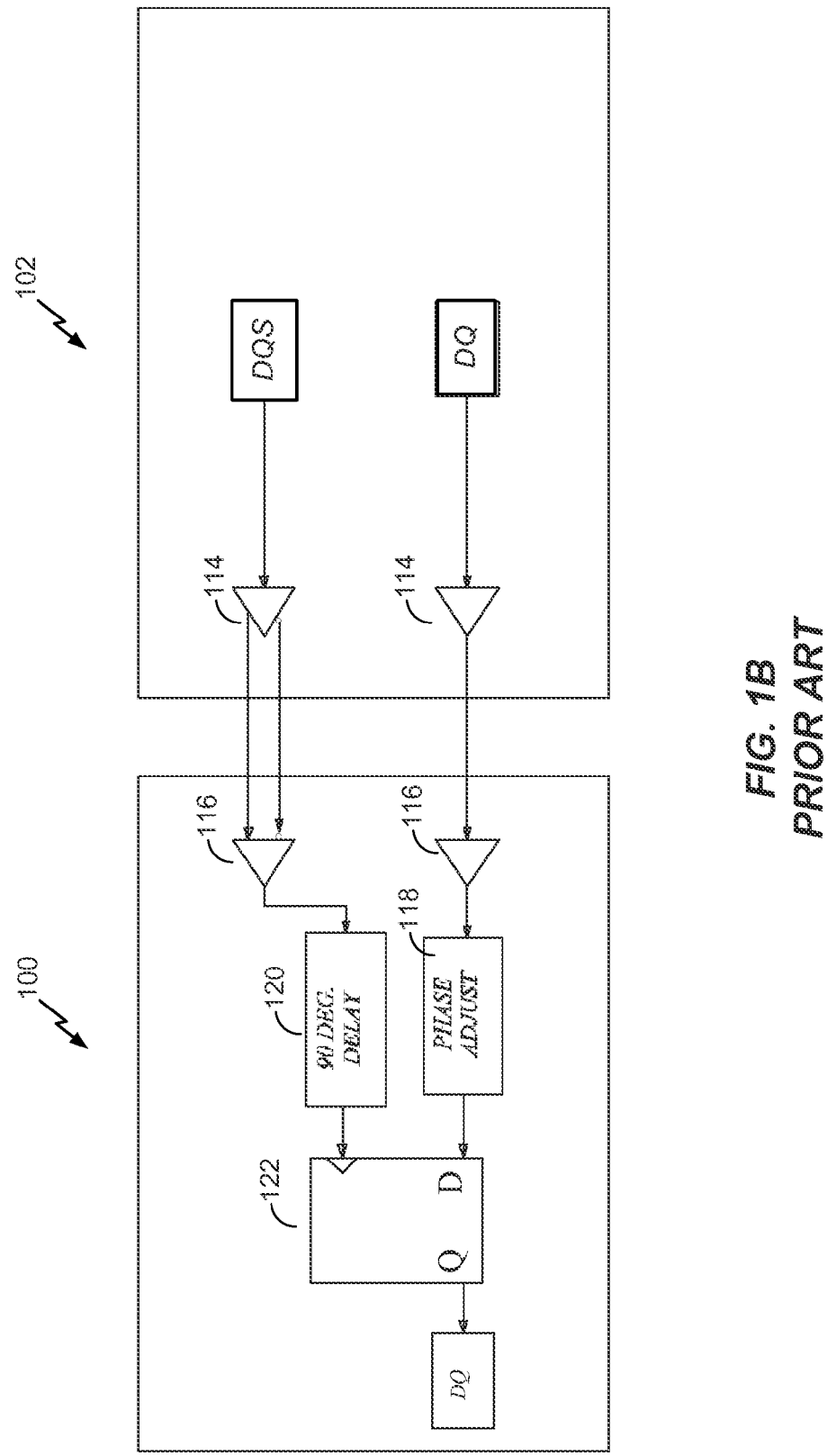
FIG. 1B is a schematic diagram illustrating an example of a memory interface in the read direction.

FIGS. 1A and 1B illustrate an example of a memory interface between a system on a chip (SOC) 100 and a memory 102 in which a write direction of the interface is described with reference to FIG. 1A and a read direction of the interface is described with reference to FIG. 1B. In FIG. 1A, a data signal (DQ) including a number of data bits is transmitted from the SOC 100 to the memory 102. The data signal is input to a phase adjust block 104. The phase adjust block 104 fine tunes the phases of the data bits in the data signal to reduce or eliminate phase differences between bits of the data signal so that they may all be latched with a single strobe signal. The strobe (DQS) is input to a 90 degree delay block 106 which causes the strobe to be 90 degrees out of phase with the data bits. This allows latching of the data bits to occur at approximately the center of each data bit pulse. The phase adjust block 104 and 90 degree delay block 106 are coupled to output buffers 108 on the SOC 100. The output buffers 108 on the SOC are coupled to input buffers 110 on the memory 102 via conductive paths on a printed circuit board, for example. The input buffers 110 are coupled to a latch 112 on the memory. Each data bit is input to a separate latch 112 on the memory 102 by the delayed strobe from an input buffer 110.

In FIG. 1B, a data signal (DQ) including a number of data bits being read from the memory 102 and a strobe signal (DQS) is output from the memory via output buffers 114. The output buffers 114 are coupled to input buffers 116 on the SOC 100 by conductive paths on a printed circuit board, for example. A phase adjust block 118 on the SOC 100 fine tunes the phases of the data bits in the data signal to reduce or eliminate phase differences between bits of the data signal so that they may all be latched with a single strobe signal. The strobe (DQS) is input to a 90 degree delay block 120 which causes the strobe to be 90 degrees out of phase with the data bits. This allows latching of the data bits to occur at approximately the center of each data bit pulse. Each data bit is input to a separate flip flop 122 on the SOC by the delayed strobe from the 90 degree delay block 120.

Figure 2:
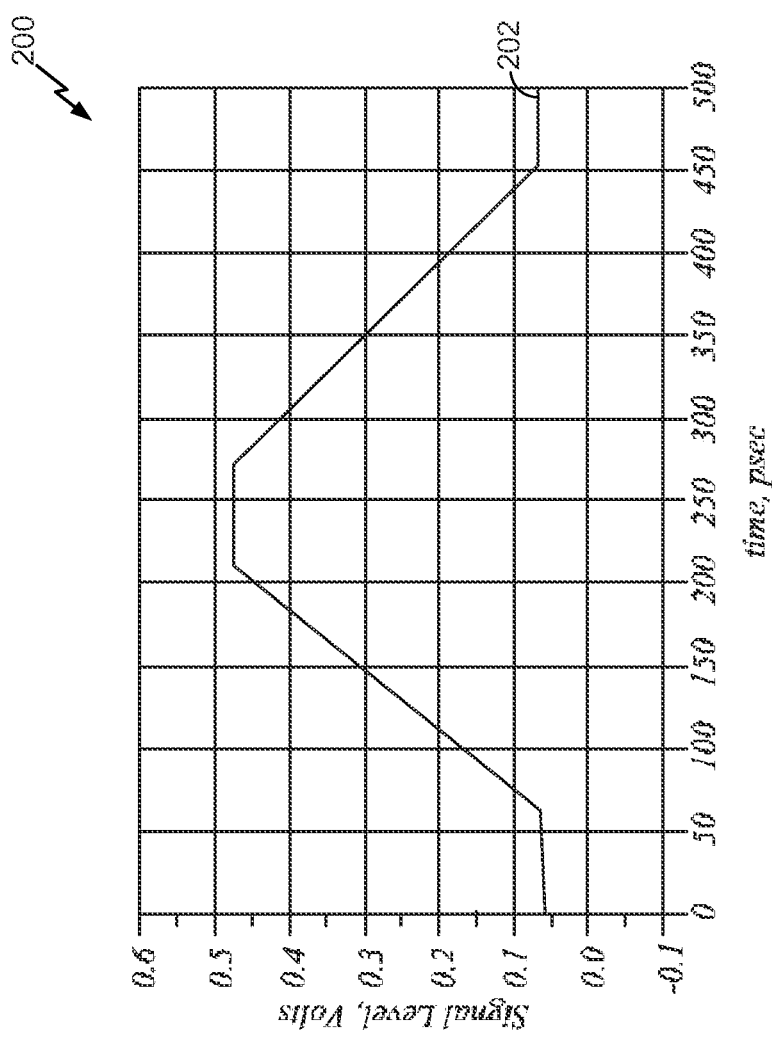
FIG. 2 is a graph illustrating timing of a memory interface signal.

FIG. 2 is a graph 200 illustrating an example of a data signal pulse 202 of a data signal, such as the data signal DQ discussed above with respect to FIGS. 1A and 1B. The data signal pulse 202 is recognizable as high data level when it exceeds an input high threshold of about 0.3 volts. Thus, it is important that a strobe signal used to clock the pulse into a flip flop occurs between about 150 picoseconds and 350 picoseconds. Performance and reliability of a memory interface may be measured by superimposing all of the data pulses through the interface on a graph such as the graph 200. Because of timing variations and strength variations between the bits, a superposition of bits on the graph results in an eye diagram.

Figure 3:
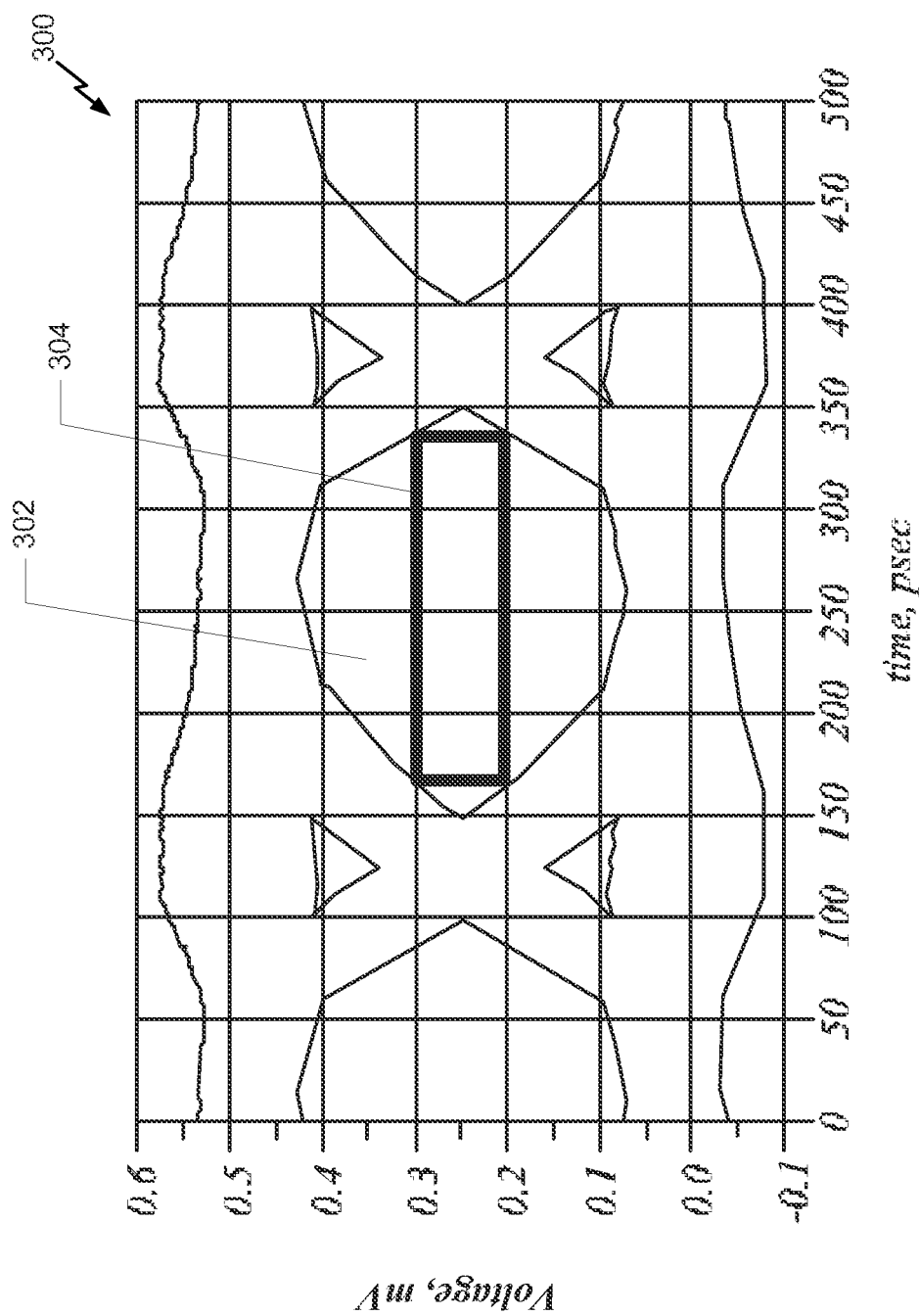
FIG. 3 is an eye diagram illustrating performance of memory interface.

FIG. 3 is an eye diagram illustrating performance of a traditional memory interface, such as the interface described above in FIGS. 1A and 1B. In the eye diagram 300, the dimensions of an aperture 302 may be measured to determine the reliability of the memory interface. Larger dimensions of the aperture 302 indicate more reliable communication across the interface because they indicate a larger margin of error within which to detect a data pulse level at a receiver. A signal pulse that intersects a mask area 304 may not be received reliably. Techniques such as data bus inversion, termination design and line impedance matching are commonly used to increase the size of the aperture 302.

According to aspects of the present disclosure, the reliability of a memory interface may be improved by delaying the data signals on a portion of the data channel. Approximately the same delay is applied to a strobe for sampling the delayed portion of the data channel. Preventing all portions of the data signal from switching at the same time greatly reduces output noise compared to a traditional memory interface as shown in FIGS. 1A and 1B, in which all of the bits have the same phase offset. Delaying a portion of the data channel according to aspects of the present disclosure may be performed in addition to other methods for improving reliability of the interface.

According to an aspect of the present disclosure, a data channel is routed by alternating delayed portions of the data channel with non-delayed portions of the data channel. Examples of alternating delayed and un-delayed portions of a data channel according to aspects of the present disclosure are described with reference to FIG. 4. In each of the examples shown in FIG. 4, odd bits on a data channel are delayed and even bits are not delayed. It should be understood that the delay could be applied to either the even or the odd bits and that the zero bit is considered to be an even bit. Although the examples shown in FIG. 4 show one byte of data signals, it should be understood that any number of bytes may be routed according to this aspect of the present disclosure.

In a first interface routing 402, between a first SOC 404 and a first memory 406, each delayed odd bit is routed adjacent to a non-delayed even bit. Other configurations according to aspects of the present disclosure may not strictly conform to such an alternating pattern. For example, in a second interface routing 408 between a second SOC 410 and a second memory 412, even bits 0 and 2 are adjacent to one another. In a third interface routing 414 between a third SOC 416 and a third memory 418, odd bits are grouped together and even bits are grouped together. The second interface routing 408 and the third interface routing 414 may be sub-optimal because they do not conform to the alternating arrangement of delayed and non-delayed portions of the data channel. However, these arrangements may still provide some of the benefits disclosed herein.

Figure 5A:
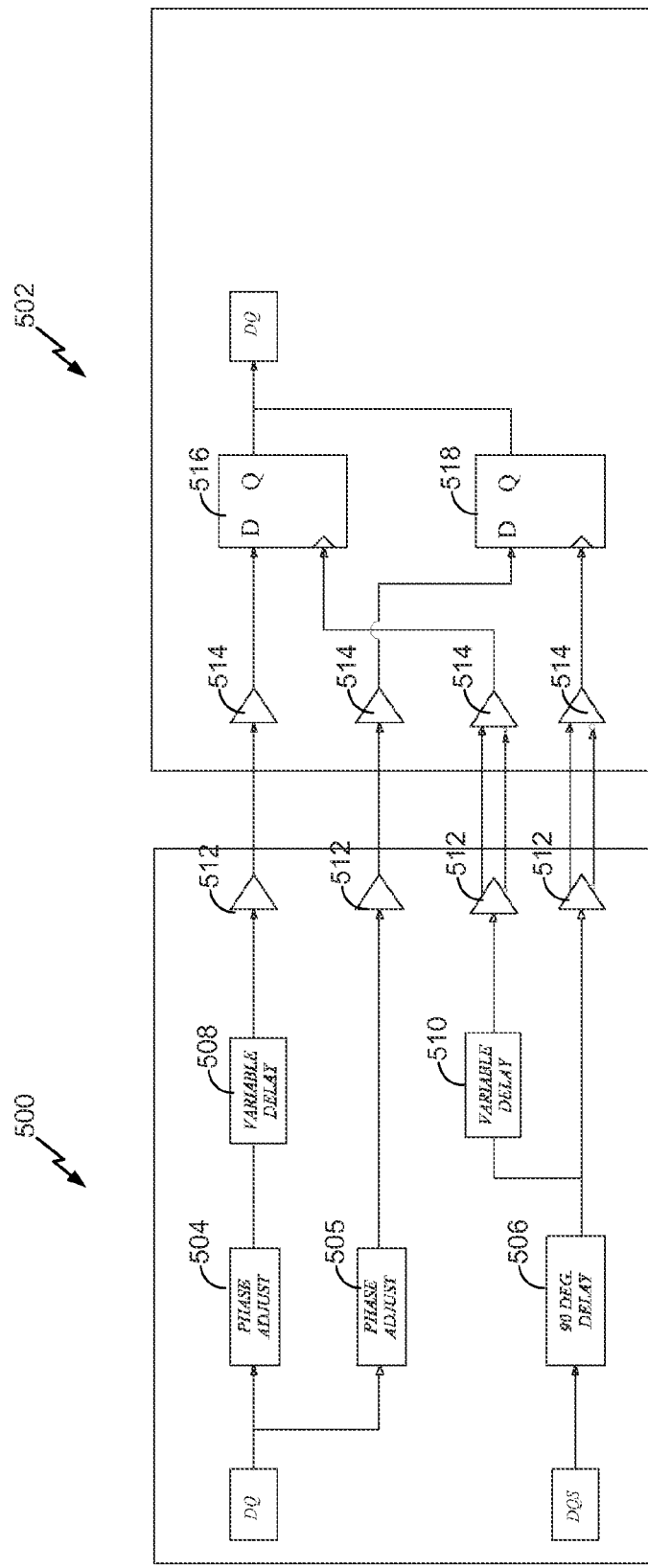
FIG. 5A is a schematic diagram of a memory interface in a write direction according to aspects of the present disclosure.
Figure 5B:
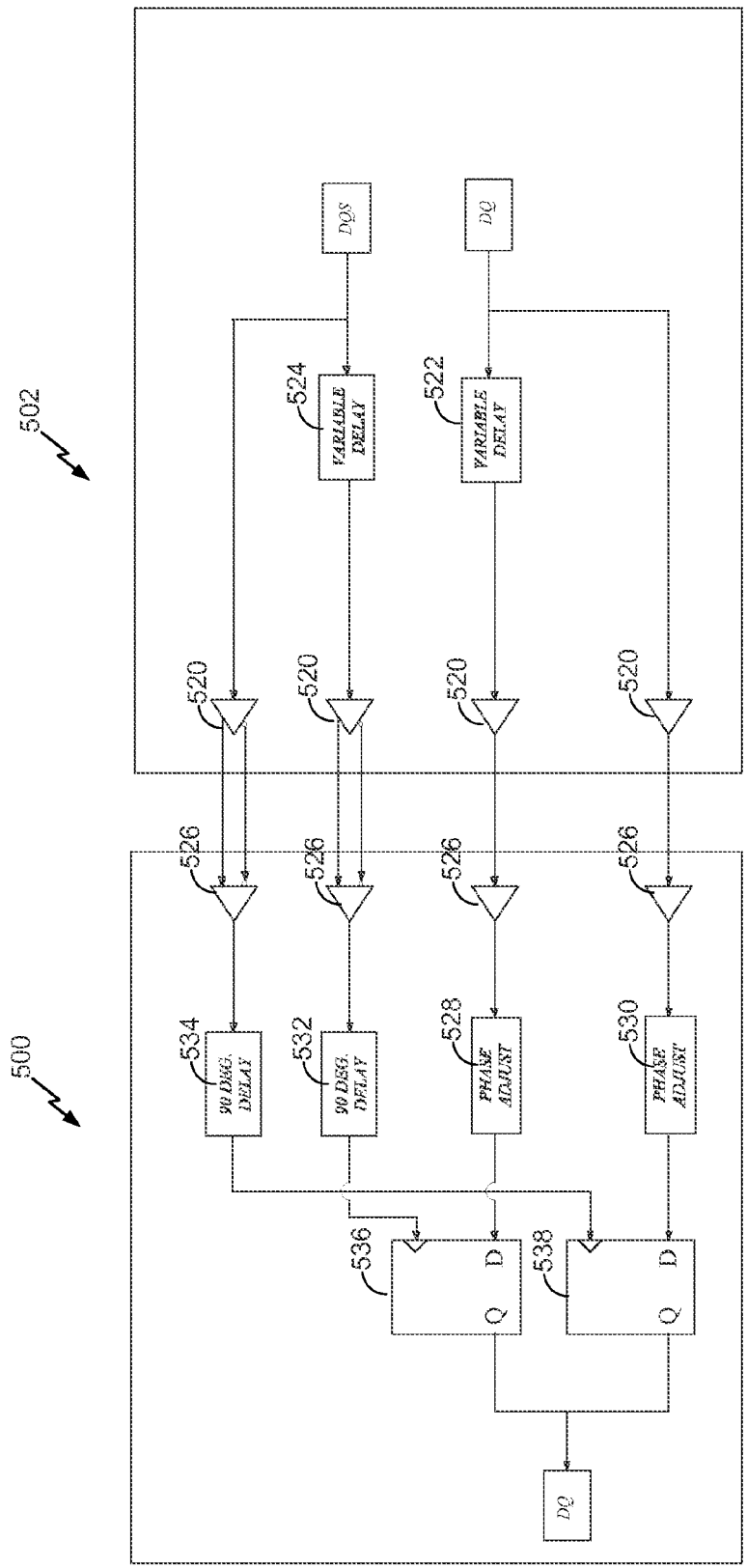
FIG. 5B is a schematic diagram of a memory interface in a read direction according to aspects of the present disclosure.

FIGS. 5A and 5B illustrate a memory interface between a system on a chip (SOC) 500 and a memory 502 in which a write direction of the interface is described with reference to FIG. 5A and a read direction of the interface is described with reference to FIG. 5B. Although the data signal DQ and a strobe DQS are shown separately in the read direction and the write direction, it should be understood by persons having ordinary skill in the art that the data signals and strobes are bi-directional signals.

In FIG. 5A, a data signal (DQ) including a number of data bits is transmitted from the SOC 500 to the memory 502. A first portion of the data signal is input to a first phase adjust block 504. A second portion of the data signal is input to a second phase adjust block 505. According to one aspect of the present disclosure, the first portion of the data signal may include only odd bits of the data signal and the second bits of the data signal may include only even bits of the data signal, for example. The first phase adjust block 504 and second phase adjust block 505 fine tune the phases of the data bits in the data signal to reduce or eliminate phase differences between bits of the data signal so that they may all be latched with a single strobe signal. The first portion of the data signal is output from the first phase adjust block to a variable delay block 508. According to an aspect of the present disclosure, the variable delay block 508 delays the first portion of the data signal relative to the second portion of the data signal by an amount determined to increase the size of an eye diagram aperture.

A strobe (DQS) is input to a 90 degree delay block 506, which causes the strobe to be 90 degrees out of phase with the non-delayed data bits. This allows latching of the non-delayed data bits to occur at approximately the center of each data bit pulse of the non-delayed data signal. An output from the 90 degree delay block 506 is coupled to a variable strobe delay block 510. The variable strobe delay block 510 generates a delayed strobe. In one aspect of the disclosure, the amount of strobe delay is the same as the variable delay applied to the data signal by the variable delay block 508. In other aspects of the disclosure, the amount of strobe delay may be different from the variable delay applied to the data signal. This allows latching of the delayed data bits to occur at approximately the center of each data bit pulse of the delayed data signal.

The phase adjust blocks 504, 505, the 90 degree delay block 506 and the variable strobe delay block 510 are coupled to output buffers 512 on the SOC 500. The output buffers 512 on the SOC are coupled to input buffers 514 on the memory 502 via conductive paths on a printed circuit board, for example. The input buffers 514 are coupled to latches 516, 518 on the memory 502. A delayed portion of the data signal output by the variable delay block 508 is input to a first flip flop 516. The first flip flop 516 is sampled by a delayed strobe output from the variable strobe delay block 510. A non-delayed portion of the data signal output by the second phase adjust block is input to a second flip flop 518 and is sampled by a 90 degree delayed strobe output from the 90 degree delay block 506. Output from the first flip flop 516 and the second flip flop 518 are combined to generate the received data signal.

In FIG. 5B, a data signal (DQ) includes a number of data bits being read from the memory 502. A first portion of the of the data signal is input to a variable delay block 522 and then output from the memory 502 via output buffers 520. A second portion of the data signal is not delayed and is output from the memory 502 via output buffers 520. According to one aspect of the present disclosure, the first portion of the data signal may include only odd bits of the data signal and the second bits of the data signal may include only even bits of the data signal, for example.

A strobe signal (DQS) is also output from the memory 502 via output buffers 520. The strobe signal is also input to a variable strobe delay block 524 to generate a delayed strobe. According to an aspect of the disclosure, the amount of delay applied to the strobe by the variable strobe delay block 524 may be the same as the amount of delay applied to the first portion of the data signal by the variable delay block 522. In another aspect of the present disclosure, the amount of delay applied to the strobe by the variable strobe delay block 524 may be different from the delay applied to the first portion of the data signal by the variable delay block. The delayed strobe output from the variable strobe delay block is output from the memory via the output buffers 520.

The output buffers 520 are coupled to input buffers 526 on the SOC 500 by conductive paths on a printed circuit board, for example. A first phase adjust block 528 on the SOC 500 fine tunes the phases of the data bits in the first portion of the data signal to reduce or eliminate phase differences between bits of the first portion of the data signal so that they may all be sampled with the same strobe signal. A second phase adjust block 530 on the SOC 500 fine tunes the phases of the data bits in the second portion of the data signal to reduce or eliminate phase differences between bits of the second portion of the data signal so that they may all be sampled with the same strobe signal. The delayed strobe output from the variable strobe delay block 524 is input to a first 90 degree delay block 532 on the SOC 500. Output from the first 90 degree delay block 532 is coupled to a first flip flop 536 to sample the first portion of the data signal output from the first phase adjust block 528 to the first flip flop 536. The non-delayed strobe is input to a second 90 degree delay block 534 on the SOC 500. Output from the second 90 degree delay block 534 is coupled to a second flip flop 538 to sample the second portion of the data signal output from the second phase adjust block 530 to the second flip flop 538. Output from the first flip flop 536 and the second flip flop 538 is combined to generate the received data signal on the SOC 500.

Although aspects of the disclosure that are described with reference to FIGS. 5A and 5B as separating a data signal into two portions, it should be understood that a data signal may be separated into more than two portions, in which each portion has a different variable delay, for example.

Figure 6:
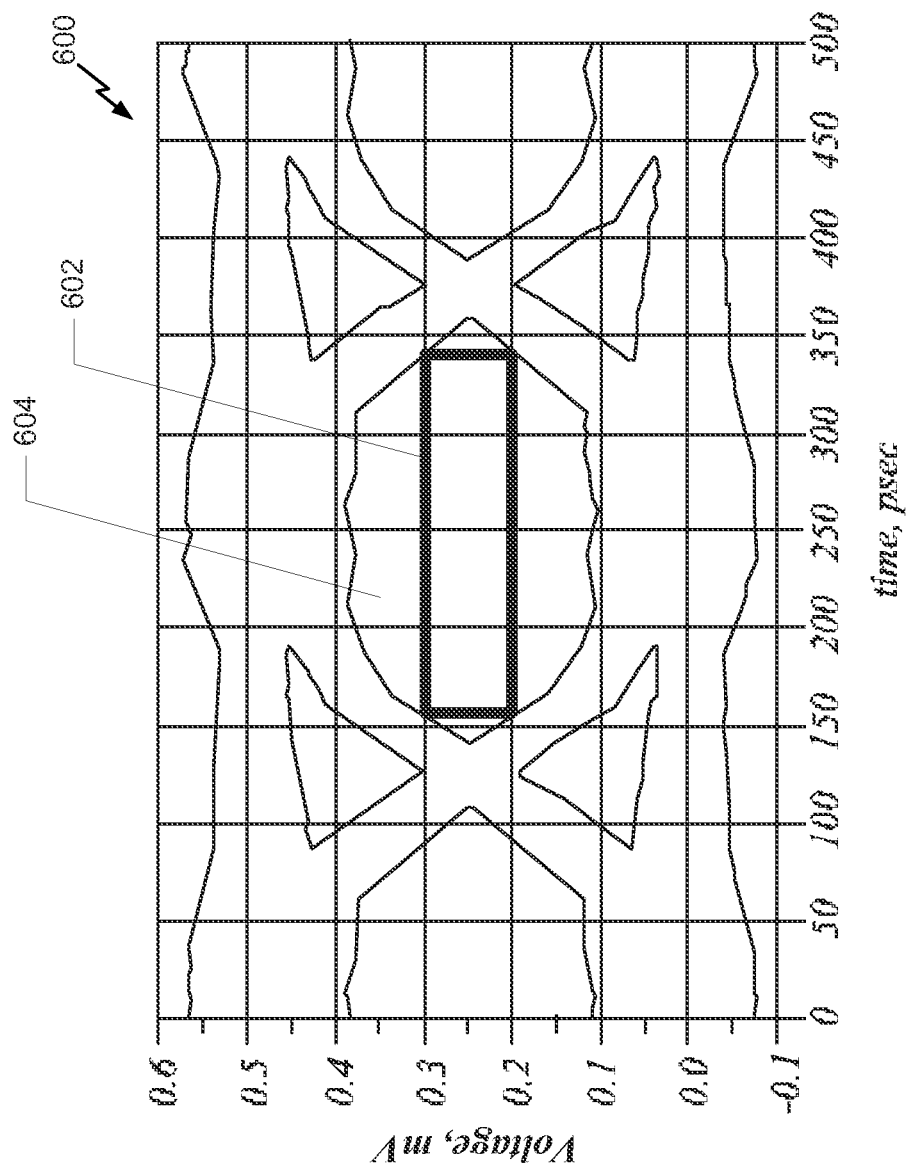
FIG. 6 is an eye diagram illustrating performance of a memory interface according to aspects of the present disclosure.
Figure 7:
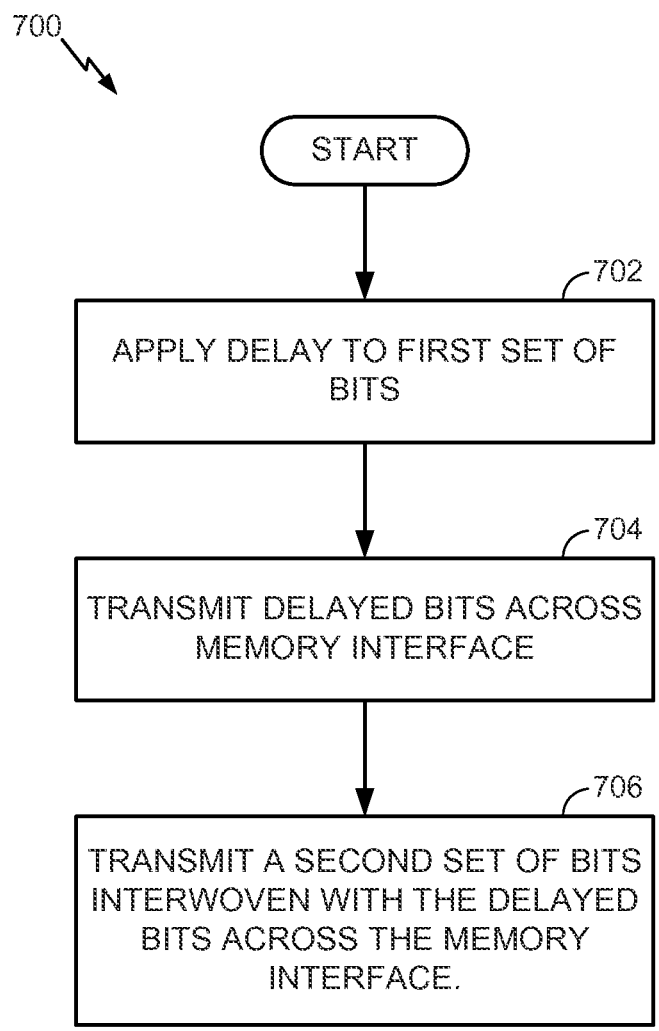
FIG. 7 is a process flow diagram illustrating a method for configuring a memory interface according to an aspect of the present disclosure.

FIG. 6 shows an eye diagram 600 illustrating performance of a memory interface according to aspects of the present disclosure, such as the interface shown in FIGS. 5A and 5B. A mask 602 fitting within the aperture 604 of the eye diagram 600 has a horizontal length that is significantly greater than the length of the mask 304 shown in FIG. 3, which represents performance of the traditional interface. This represents a significant performance improvement provided by aspects of the present disclosure. A slightly smaller vertical dimension of the mask 602 compared to the mask 304 shown in FIG. 3 does not significantly diminish the improvement because the horizontal dimension of the mask 602 is a stronger indicator of performance. The eye diagram 600 was configured with particular interface parameters, such as a specific trace length on the PCB and a certain number of memory loads, for example. It should be understood that an eye diagram could be generated showing even greater improvement for different interface parameters A method for configuring a memory interface according to aspects of the present disclosure is described with reference to FIG. 7. In block 702, the method includes applying an operating delay to only a first set of bits of a data channel of a memory interface waveform. In block 704, the method includes transmitting the delayed first set of bits across the memory interface. In block 706, the method includes transmitting a second set of bits of the data channel across the memory interface. The first set of bits are interwoven with the second set of bits on the data channel.

Figure 8:
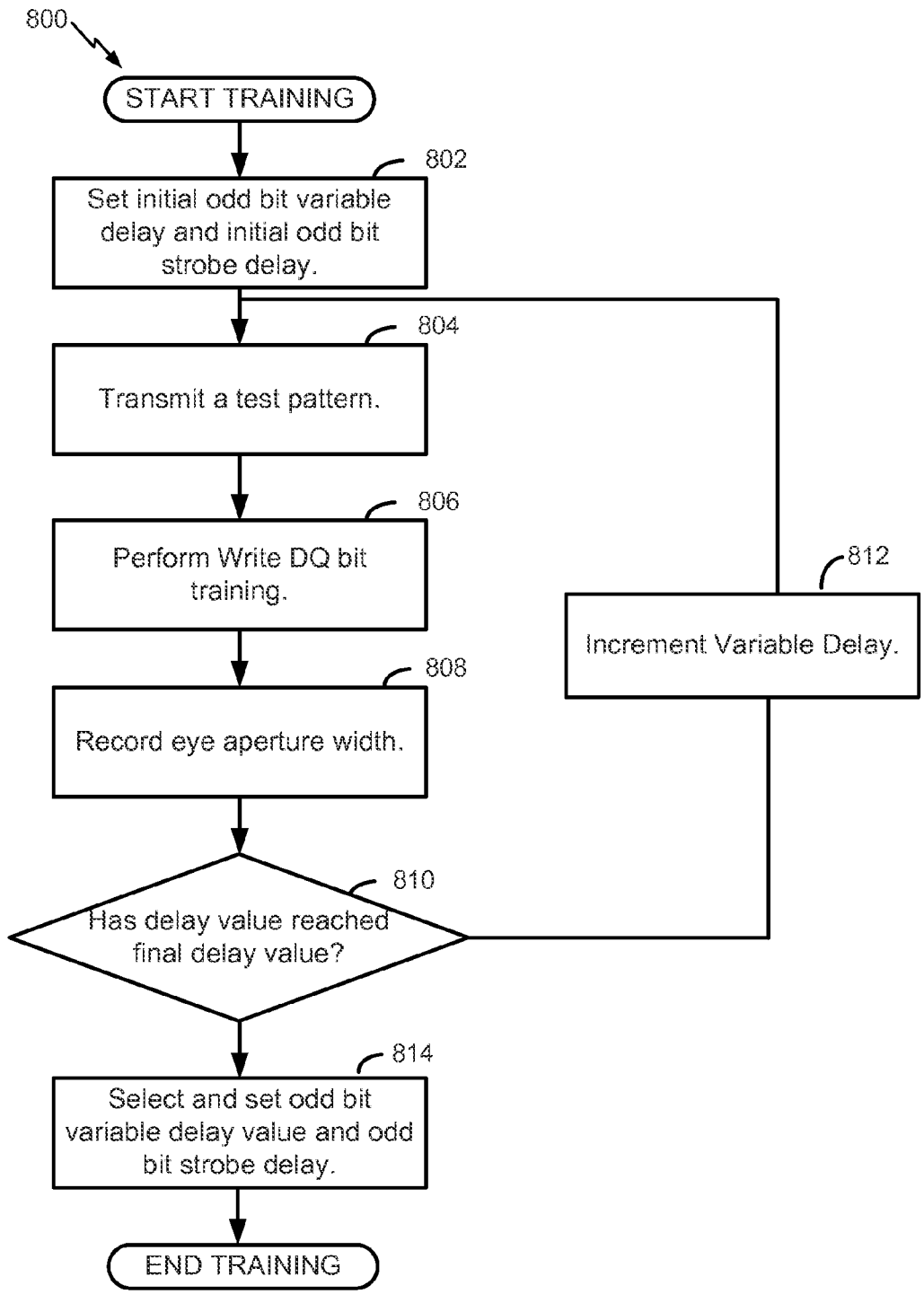
FIG. 8 is a process flow diagram illustrating a method for determining and setting a variable delay in a memory interface according to an aspect of the present disclosure.

The delay value is selected to improve a signal integrity of the memory interface waveform. The signal integrity is determined in a training block by measuring the eye aperture width of the memory interface. A method for determining a variable delay by a training block according to an aspect of the present disclosure is described with reference to FIG. 8. When a training process begins, at block 802 an odd bit variable delay is set to an initial value, such as 60 degrees, for example. A strobe delay for the odd bits is also set to an initial strobe delay value, such as 60 degrees, for example. At block 804 a test pattern including both even and odd bits is transmitted. The test pattern may include a stressful aggressor pattern, for example. At block 806, a WRITE DQ bit training is performed to adjust the phase of bits in the test pattern. At block 808, an eye aperture width is recorded based on the test pattern. If the delay value has not reached a final value (Block 810:NO), in block 812 the variable delay is incremented by some amount, such as 10 degrees, for example and the process returns to block 804 to transmit the same test pattern with the new variable delay value. If, at block 810, the process determines the delay value has reached a final delay value, at block 814 an odd bit variable delay and odd bit strobe delay are selected corresponding to the best eye aperture width recorded in block 808.

In one configuration, a memory interface includes means for reducing crosstalk and noise in a memory interface. The memory interface includes means for applying an operating delay to only a first set of bits of a data channel of a memory interface waveform. The means for applying an operating delay may include the variable delay blocks 508, 510 as described in FIG. 5A, for example. The memory interface also includes means for transmitting the delayed first set of bits across the memory interface. The means for transmitting the delayed first set of bits may include output buffers 512 and input buffers 514 as described in FIG. 5A, for example. The memory interface also includes means for transmitting a second set of bits of the data channel across the memory interface. The first set of bits is interwoven with the second set of bits on the data channel. The means for transmitting the second set of bits may also include the output buffers 512 and input buffers 514 as described in FIG. 5A, for example. In another configuration, the aforementioned means may be any module or any apparatus configured to perform the functions recited by the aforementioned means. Although specific means have been set forth, it will be appreciated by those skilled in the art that not all of the disclosed means are required to practice the disclosed configurations. Moreover, certain well known means have not been described, to maintain focus on the disclosure.

Figure 9:
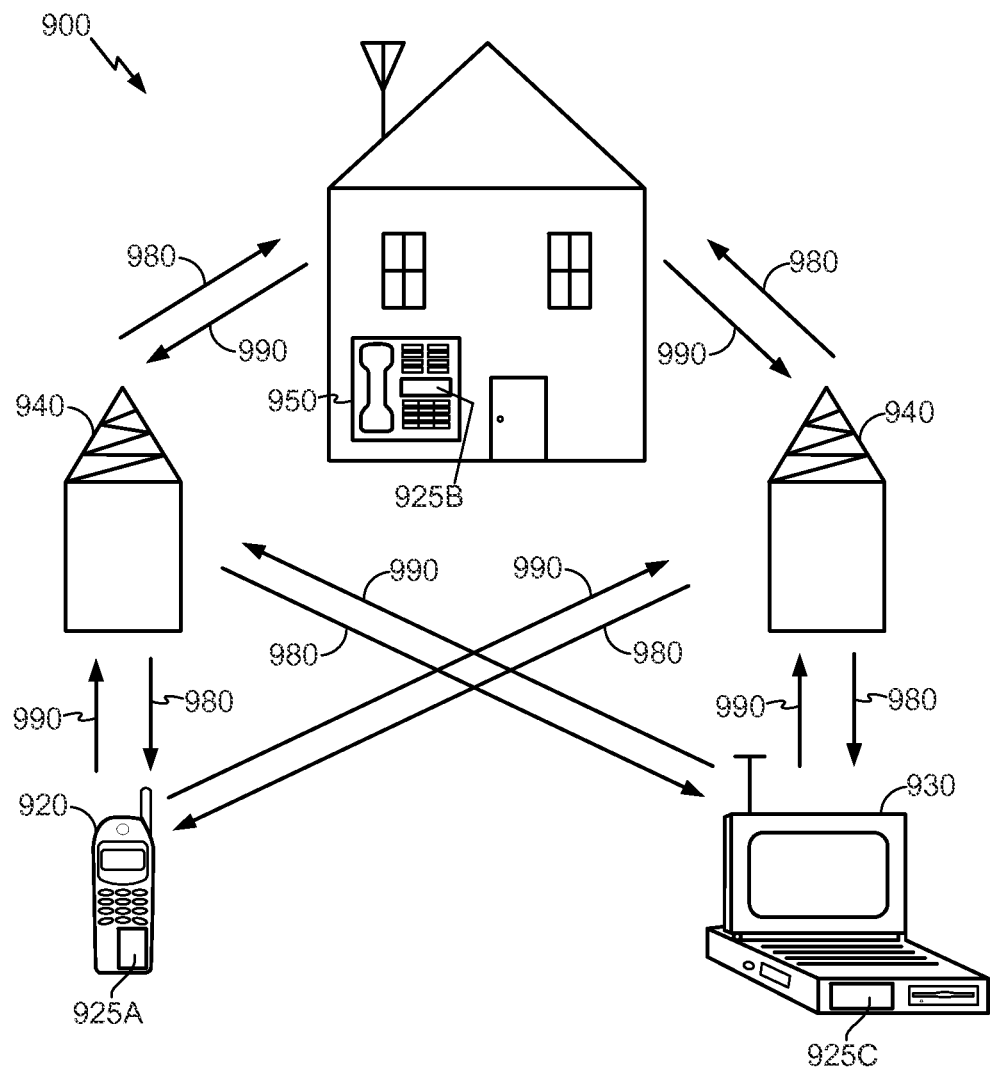
FIG. 9 shows an exemplary wireless communication system in which a configuration of the disclosure may be advantageously employed.

FIG. 9 shows an exemplary wireless communication system 900 in which a configuration of the disclosed memory interface may be advantageously employed. For purposes of illustration, FIG. 9 shows three remote units 920, 930, and 950 and two base stations 940. It will be recognized that wireless communication systems may have many more remote units and base stations. Remote units 920, 930, and 950 include the memory interface 925A, 925B, and 925C, respectively. FIG. 9 shows forward link signals 980 from the base stations 940 and the remote units 920, 930, and 950 and reverse link signals 990 from the remote units 920, 930 and 950 to base stations 940.

In FIG. 9, the remote unit 920 is shown as a mobile telephone, remote unit 930 is shown as a portable computer, and remote unit 950 is shown as a fixed location remote unit in a wireless local loop system. For example, the remote units may be cell phones, hand-held personal communication systems (PCS) units, portable data units such as personal data assistants, or fixed location data units such as meter reading equipment. Although FIG. 9 illustrates remote units, which may employ a memory interface according to the teachings of the disclosure, the disclosure is not limited to these exemplary illustrated units. For instance, memory interface circuitry according to configurations of the present disclosure may be suitably employed in any device.

Figure 10:
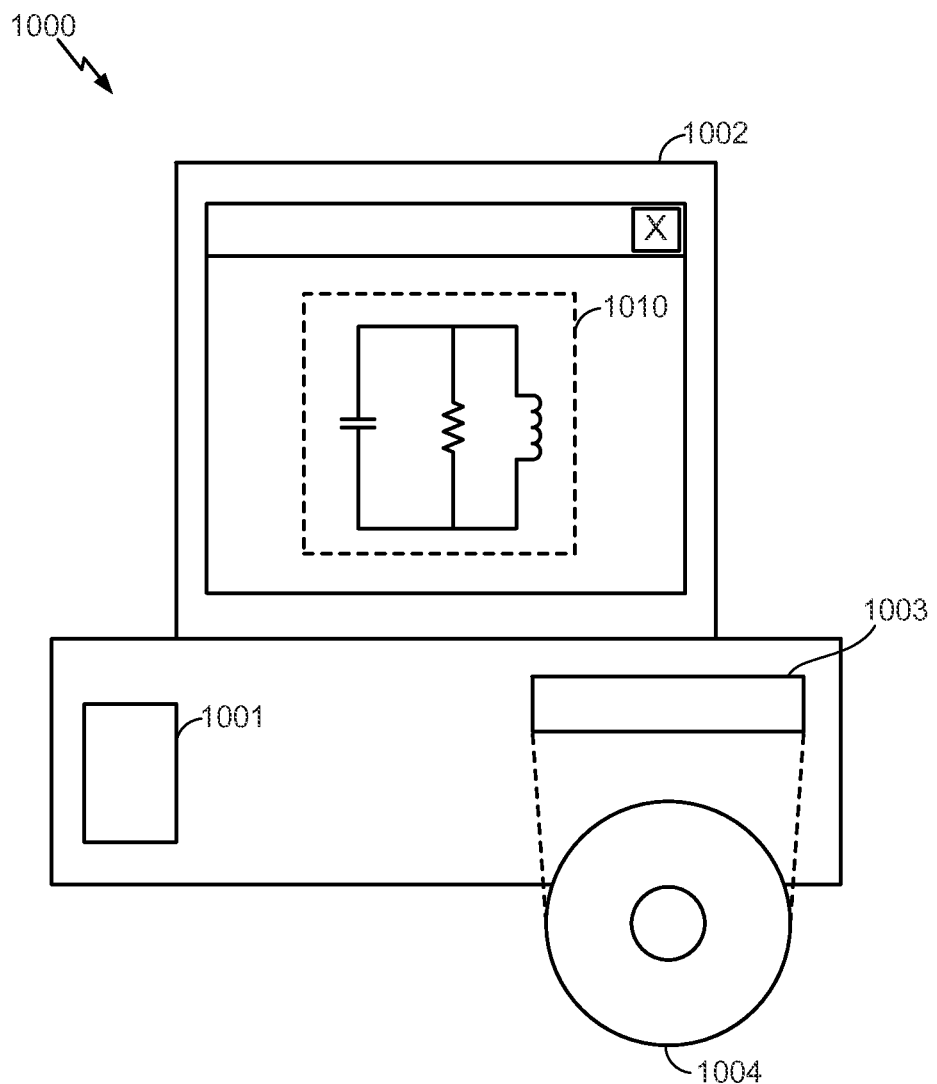
FIG. 10 is a block diagram illustrating a design workstation for circuit, layout, and logic design of a semiconductor component according to one aspect of the present disclosure.

FIG. 10 is a block diagram illustrating a design workstation used for circuit, layout, and logic design of a semiconductor component, such as the memory interface circuitry disclosed above. A design workstation 1000 includes a hard disk 1001 containing operating system software, support files, and design software such as Cadence or OrCAD. The design workstation 1000 also includes a display 1002 to facilitate design of a circuit 1010 or a semiconductor component 1012 such as the memory interface circuitry. A storage medium 1004 is provided for tangibly storing the circuit design 1010 or the semiconductor component 1012. The circuit design 1010 or the semiconductor component 1012 may be stored on the storage medium 1004 in a file format such as GDSII or GERBER. The storage medium 1004 may be a CD-ROM, DVD, hard disk, flash memory, or other appropriate device. Furthermore, the design workstation 1000 includes a drive apparatus 1003 for accepting input from or writing output to the storage medium 1004.

Data recorded on the storage medium 1004 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 1004 facilitates the design of the circuit design 1010 or the semiconductor component 1012 by decreasing the number of processes for designing semiconductor wafers.

Although specific circuitry has been set forth, it will be appreciated by those skilled in the art that not all of the disclosed circuitry is required to practice the disclosed configurations. Moreover, certain well known circuits have not been described, to maintain focus on the disclosure.

For a firmware and/or software implementation, the methodologies may be implemented with modules (e.g., procedures, functions, and so on) that perform the functions described herein. A machine-readable medium tangibly embodying instructions may be used in implementing the methodologies described herein. For example, software codes may be stored in a memory and executed by a processor unit. Memory may be implemented within the processor unit or external to the processor unit. As used herein the term "memory" refers to types of long term, short term, volatile, nonvolatile, or other memory and is not to be limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can be used to store desired program code in the form of instructions or data structures and that can be accessed by a computer; disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and its advantages have been described in detail, it should be understood that various changes, substitutions and alterations can be made herein without departing from the spirit and scope of the disclosure as defined by the appended claims. Moreover, the scope of the present application is not intended to be limited to the particular configurations of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed that perform substantially the same function or achieve substantially the same result as the corresponding configurations described herein may be utilized according to the present disclosure. Accordingly, the appended claims are intended to include within their scope such processes, machines, manufacture, compositions of matter, means, methods, or steps.

What is claimed is:

1. A memory interface method, comprising:
    applying an operating delay to only a first set of bits of a data channel of a memory interface waveform;
    transmitting the delayed first set of bits across a memory interface;
    transmitting a second set of bits of the data channel across the memory interface, in which a first set of signal lines transferring the first set of bits is interwoven with a second set of signal lines transferring the second set of bits on the data channel;
applying a strobe delay to a first strobe to generate a second strobe;
transmitting the first strobe and the second strobe across the memory interface;
sampling the delayed first set of bits with the second strobe; and
sampling the second set of bits with the first strobe.

2. The memory interface method of claim 1, in which the first set of bits comprises only odd bits of the data channel and the second set of bits comprises only even bits of the data channel.

3. The memory interface method of claim 1, further comprising:
applying a first training delay value to only the first set of bits;
applying a first training strobe delay value to the first strobe;
applying a second training delay value to only the first set of bits;
applying a second training strobe delay value to the first strobe; and
setting the operating delay equal to the first training delay value when a first signal integrity is greater than a second signal integrity.

4. The memory interface method of claim 3, further comprising:
sampling the first set of bits by the first strobe after applying the first training delay value to the first set of bits;
measuring the first signal integrity of the memory interface waveform including the first training delay value;
sampling the first set of bits by the first strobe after applying the second training delay value to the first set of bits; and
measuring the second signal integrity of the memory interface waveform including the second training delay value.

5. The method of claim 1, further comprising integrating the memory interface into at least one of a mobile phone, a set top box, a music player, a video player, an entertainment unit, a navigation device, a computer, a hand-held personal communication systems (PCS) unit, a portable data unit, and a fixed location data unit.

6. A memory interface, comprising:
means for applying an operating delay to only a first set of bits of a data channel of a memory interface waveform;
means for transmitting the delayed first set of bits across the memory interface;
means for transmitting a second set of bits of the data channel across the memory interface, in which a first set of signal lines transferring the first set of bits is interwoven with a second set of signal lines transferring the second set of bits on the data channel;
means for applying a strobe delay to a first strobe to generate a second strobe;
means for transmitting the first strobe and the second strobe across the memory interface;
means for sampling the delayed first set of bits with the second strobe; and
means for sampling the second set of bits with the first strobe.

7. The memory interface of claim 6, in which the first set of bits comprises only odd bits of the data channel and the second set of bits comprises only even bits of the data channel.

8. The memory interface of claim 6, further comprising:
means for applying a first training delay value to only the first set of bits;
means for applying a first training strobe delay value to the first strobe;
means for applying a second training delay value to only the first set of bits;
means for applying a second training strobe delay value to the first strobe; and
means for setting the operating delay equal to the first training delay value when a first signal integrity is greater than a second signal integrity.

9. The memory interface of claim 8, further comprising:
means for sampling the first set of bits by the first strobe after applying the first training delay value to the first set of bits;
means for measuring a first signal integrity of the memory interface waveform including the first training delay value;
means for sampling the first set of bits by the first strobe after applying the second training delay value to the first set of bits; and
means for measuring the second signal integrity of the memory interface waveform including the second training delay value.

10. The memory interface of claim 6, integrated in at least one of a mobile phone, a set top box, a music player, a video player, an entertainment unit, a navigation device, a computer, a hand-held personal communication systems (PCS) unit, a portable data unit, and a fixed location data unit.

11. A memory interface, comprising:
a first data path coupled to a first set of bits of a data signal;
a first variable delay circuit coupled between the first data path and a first latch;
a second data path coupled between a second set of bits of the data signal and a second latch, in which the first data path is at least partially interwoven with the second data path;
a first strobe path coupled to a first strobe signal;
a second variable delay circuit coupled between the first strobe path and the first latch; and
a second strobe path coupled between the first strobe signal and the second latch.

12. The memory interface of claim 11, in which the first variable delay circuit is configured with a delay value determined to reduce an eye aperture length of the data signal.

13. The memory interface of claim 12, further comprising: training circuitry coupled to the first variable delay circuit, the training circuitry configured to determine and set the delay value.

14. The memory interface of claim 11, in which the first variable delay circuit and the second variable delay circuit are configured with the same delay value.

15. The memory interface of claim 11, in which the first data path comprises only odd bits of the data signal and the second data path comprises only even bits of the data signal or vice versa.

16. The memory interface of claim 11, further comprising a fixed delay circuit coupled in the first strobe path.

17. The memory interface of claim 11, integrated in at least one of a mobile phone, a set top box, a music player, a video player, an entertainment unit, a navigation device, a computer, a hand-held personal communication systems (PCS) unit, a portable data unit, and a fixed location data unit.

* * * * *